United States Patent
Kelley et al.

(10) Patent No.: US 7,070,674 B2
(45) Date of Patent: Jul. 4, 2006

(54) METHOD OF MANUFACTURING A MULTI-LAYERED PIEZOELECTRIC ACTUATOR

(75) Inventors: Kurtis C. Kelley, Washington, IL (US); Jerry P. Maushard, Peoria, IL (US); L. Glenn Waterfield, Chillicothe, IL (US)

(73) Assignee: Caterpillar, Peoria, IL (US)

( * ) Notice: Subject to any disclaimer, the term of this patent is extended or adjusted under 35 U.S.C. 154(b) by 292 days.

(21) Appl. No.: 10/327,719

(22) Filed: Dec. 20, 2002

(65) Prior Publication Data

US 2004/0117960 A1 Jun. 24, 2004

(51) Int. Cl.
*B32B 37/06* (2006.01)

(52) U.S. Cl. .................... 156/307.7; 156/322

(58) Field of Classification Search .......... 156/307, 156/160, 311, 286, 312, 322, 307.7; 29/25.35, 29/446
See application file for complete search history.

(56) References Cited

U.S. PATENT DOCUMENTS

| | | | | |
|---|---|---|---|---|
| 3,960,635 A | * | 6/1976 | La Roy et al. | ............ 156/286 |
| 5,632,841 A | | 5/1997 | Hellbaum et al. | |
| 5,849,125 A | | 12/1998 | Clark | |
| 5,909,905 A | | 6/1999 | Simpson et al. | |
| 6,030,480 A | | 2/2000 | Face, Jr. et al. | |
| 6,156,145 A | | 12/2000 | Clark | |
| 6,379,809 B1 | | 4/2002 | Simpson et al. | |
| 6,512,323 B1 | * | 1/2003 | Forck et al. | ............ 310/332 |
| 2001/0043027 A1 | | 11/2001 | Hellbaum et al. | |

FOREIGN PATENT DOCUMENTS

EP 1 263 060 A2 12/2002

OTHER PUBLICATIONS

"Thin-layer composite unimorph ferroelectric driver and sensor properties," Materials Letters, vol. 35, pp. 39-49, Apr. 1998, Mossi et al.

* cited by examiner

*Primary Examiner*—Jeff H. Aftergut
*Assistant Examiner*—Chris Schatz
(74) *Attorney, Agent, or Firm*—Kelsey L. Milman; Finnegan, Henderson, Farabow, Garrett & Dunner

(57) ABSTRACT

Method of manufacturing a piezoelectric actuator. The method includes a pre-cure step in which the adhesive is heated to a temperature below the melting point of the adhesive. A stack is formed having a piezoelectric layer and at least one supporting layer with the pre-cured adhesive therebetween. The stack is then cured to form a bonded laminate. The temperature at which the pre-cure occurs allows for the pre-stress in the piezoelectric layer to be modified without changing the material of the supporting layer.

17 Claims, 3 Drawing Sheets

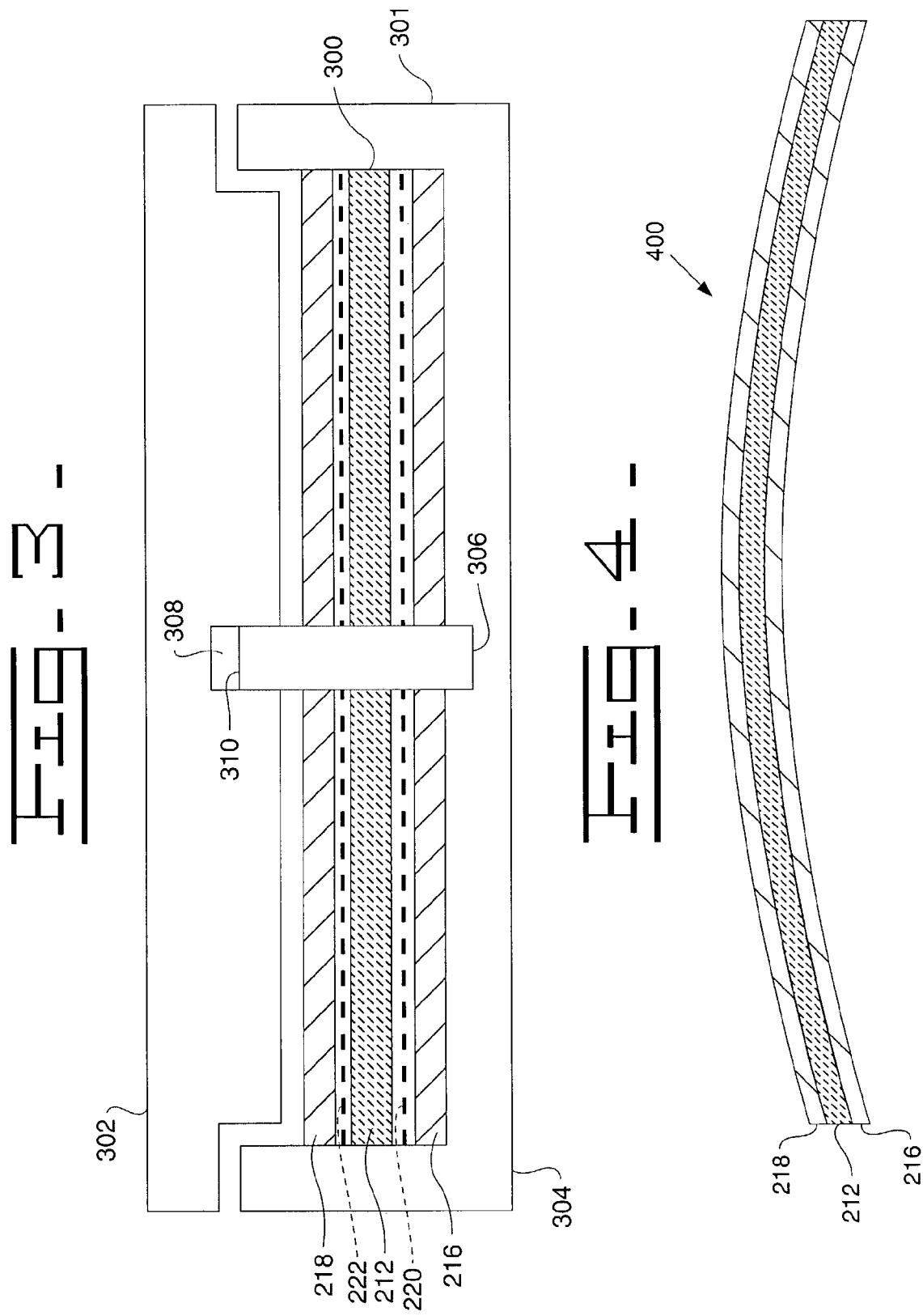

METHOD OF MANUFACTURING A MULTI-LAYERED PIEZOELECTRIC ACTUATOR

TECHNICAL FIELD

The present invention relates generally to piezoelectric actuators and, more particularly, to a method of manufacturing pre-stressed piezoelectric actuators.

BACKGROUND

Piezoelectric devices, such as piezoelectric benders or actuators, generally consist of a piezoelectric material that deforms when an electric field is applied across it. Additional materials may be bonded with the piezoelectric material, such as metallic layers that act as electrodes, insulating materials to prevent current from flowing between particular areas of the device, and adhesives to bond the various layers together.

A typical piezoelectric device, such as a piezoelectric actuator, may be comprised of an electroactive layer, comprised of various types of ceramics, disposed between a reinforcing layer and a top or conductive layer, although other configurations, such as electroplating, are also possible.

It is also generally known to provide a pre-stress to the piezoelectric material, thus increasing the displacement capability. A method for producing pre-stressed piezoelectric devices typically includes the steps of creating a composite structure by layering the ceramic layer with one or more supporting layers with thermoplastic adhesive layers therebetween. The composite structure is heated to a temperature above the melting point of the adhesive and below the Curie temperature of the ceramic (in order not to destroy the piezoelectric characteristics of the ceramic). The composite structure is then allowed to cool to an ambient temperature during which time the adhesive sets and bonds the layers. Due to the differences in the coefficients of thermal expansion of the ceramic layer, the supporting layer(s), and the adhesive, the ceramic layer becomes typically compressively stressed as the composite structure cools. In addition, due to the greater thermal contraction of at least one of the supporting layers than the ceramic layer, the structure, as it cools, deforms into a domed, or arcuate, shape.

It has also been recognized that the amount of pre-stress imparted to the ceramic layer is dependent on the changes in temperature of both the ceramic and supporting layers during the cooling step of the process. As seen in U.S. Pat. No. 6,156,145 issued to Clark, a method of manufacturing pre-stressed piezoelectric devices is disclosed, the method allowing for the supporting layer to have a greater temperature drop during the cooling step than the temperature drop of the ceramic layer. In this method, the supporting layer has an adhesive applied, and then the supporting layer is heated to above the melting point of the adhesive. A ceramic layer is positioned onto the heated supporting layer, with the melted adhesive disposed therebetween; the ceramic layers is preferably initially at a lower temperature than the supporting layer. Pressure is applied to the structure, and the structure is allowed to cool to an ambient temperature. Thus, the temperature drop to ambient temperature of the supporting layer is greater than that of the ceramic layer. And due, in part, to the differences in temperature drop, the ceramic layers is compressively pre-stressed as the structure cools. However, this method requires that the ceramic layer be applied once the adhesive is melted, which may be difficult. In addition, to vary the amount of pre-stress imparted to the ceramic layer, the difference between the individual temperatures of both the supporting layer and the ceramic layer may need to be adjusted.

Accordingly, the present invention is directed to overcoming one or more of the problems as set forth above.

SUMMARY OF THE INVENTION

It is to be understood that both the foregoing general description and the following detailed description are exemplary and explanatory only and are not restrictive of the invention as claimed.

In a first embodiment, a method for manufacturing a piezoelectric actuator is disclosed. The method comprises applying a first adhesive to at least one of a first surface of a piezoelectric layer and a first surface of a first supporting layer, the piezoelectric layer and the first supporting layer each having at least first and second surfaces; heating the at least one layer having the applied adhesive to a first temperature; cooling the at least one layer having the applied adhesive to a first ambient temperature; assembling the piezoelectric and first supporting layers into a stack, the applied adhesive being disposed between the piezoelectric layer and the first supporting layer; heating the stack to a second temperature; and cooling the stack to a second ambient temperature.

In a second embodiment, a method for manufacturing a piezoelectric actuator is disclosed. The method comprises precuring an adhesive; assembling a stack comprised of a piezoelectric layer and a first supporting layer, the adhesive disposed therebetween; heating the stack above the melting point of the adhesive; and cooling the stack to a final ambient temperature.

In a third embodiment, a method for manufacturing a piezoelectric actuator is disclosed. The method comprises selecting a first adhesive layer, a piezoelectric layer, and a first supporting layer; precuring the adhesive layer; assembling a stack comprised of the piezoelectric layer and the first supporting layer with the first adhesive layer disposed therebetween; and curing the stack to form a bonded laminate.

BRIEF DESCRIPTION OF THE DRAWINGS

The accompanying drawings illustrate exemplary embodiments of the invention and, together with the description, serve to explain the principles of the invention.

FIG. 3 is a diagrammatic representation of the layers stacked in a press in an exemplary embodiment of the present invention; and FIG. 4 is a diagrammatic representation of a bonded laminate resulting from an exemplary embodiment of the present invention.

DETAILED DESCRIPTION

Reference will now be made in detail to embodiments of the invention, examples of which are illustrated in the accompanying drawings. Whenever possible, the same reference numbers will be used throughout the drawings to refer to the same or like parts.

Figure 1:
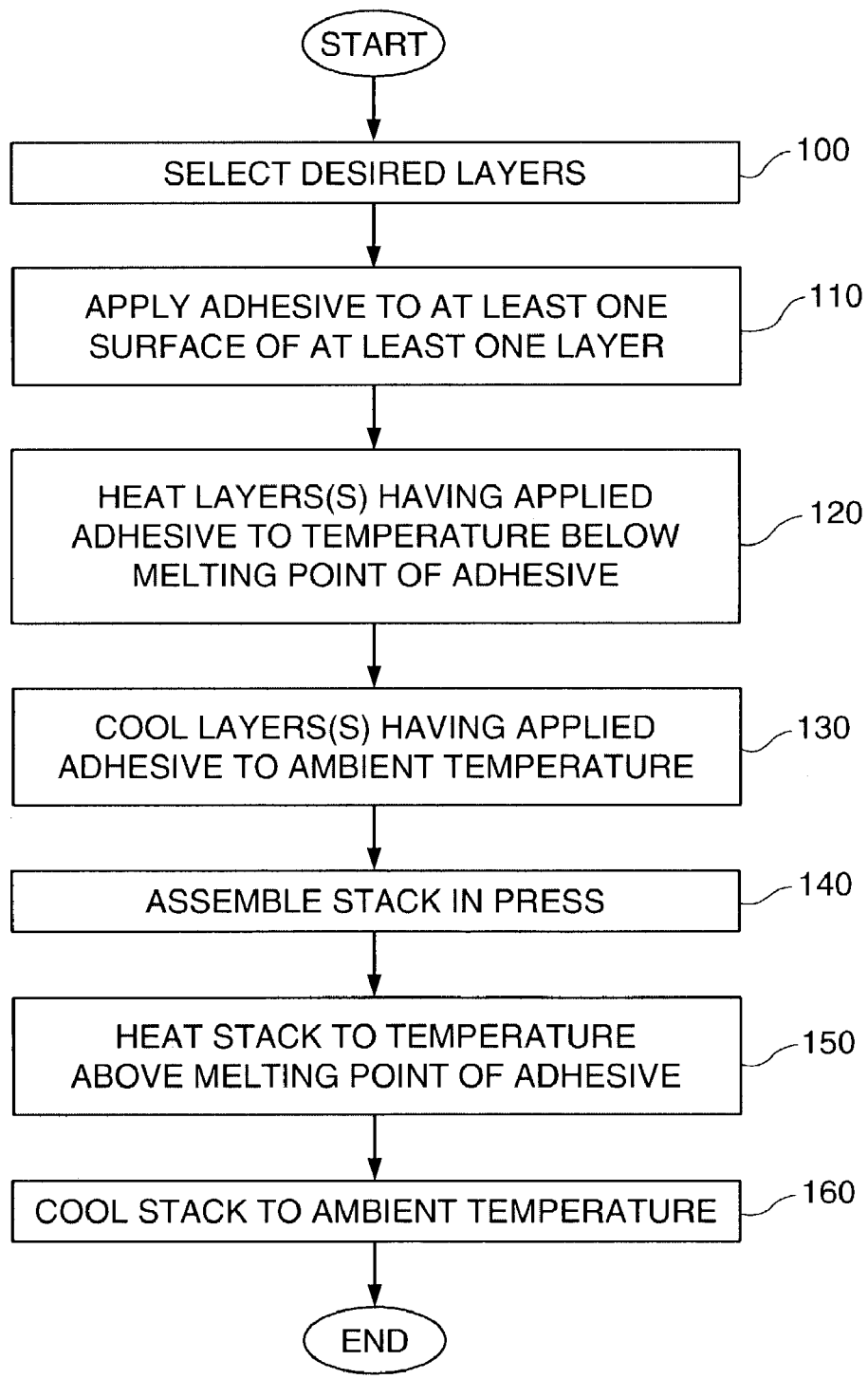
FIG. 1 is a flow chart of an exemplary embodiment of the present invention.
Figure 2:
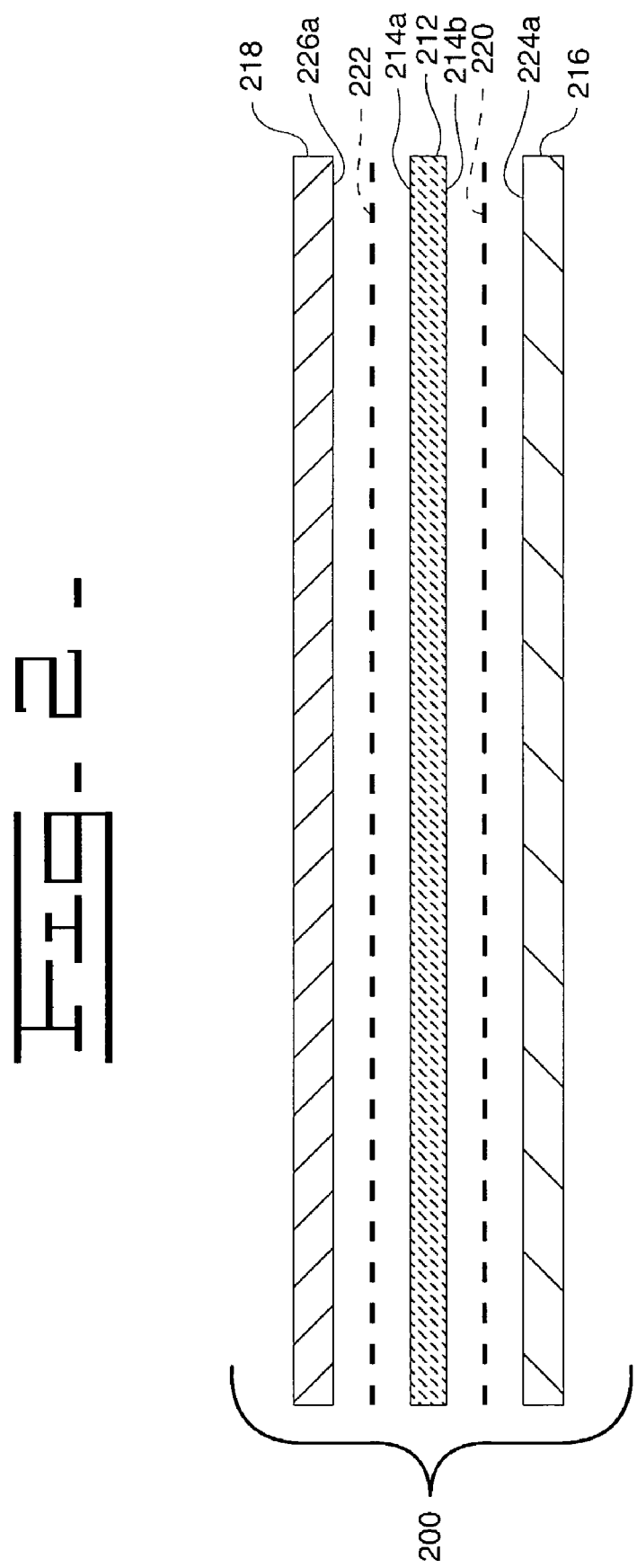
FIG. 2 is a diagrammatic representation of the layers used to form a piezoelectric actuator in an exemplary embodiment of the present invention.

FIG. 1 illustrates an exemplary embodiment of a method of manufacturing piezoelectric devices. As seen in control block 100, the desired layers are selected. The layers to be selected can be seen in FIG. 2 which illustrates an exemplary embodiment of an assembled piezoelectric device 200. Preferably, initially three layers are selected—a ceramic, or piezoelectric, layer 212 and first and second supporting layers 216 and 218. The ceramic layer 212 may be comprised of any active ceramic material, such as piezoelectric, electrostrictive or other ferroelectric ceramics. The ceramic layer 212 may optionally be provided with a thin metal conductive coating (not shown) on opposing surfaces 214a and 214b, which if necessary, may function as electrodes, as is known in the art. By way of example and not limitation, such conductive coating could comprise nickel, silver, copper, aluminum, tin, gold, chromium or alloys thereof.

The first and second supporting layers 216 and 218 may be comprised of virtually any material, such as fiberglass, beryllium, copper, graphite, steel, etc. However, both supporting layers 216 and 218 are preferably comprised of a conductive material, and carbon steel and copper are the preferred materials for the first and second supporting layers, respectively, due, at least in part, to these materials' coefficients of thermal expansion and modulus of elasticity. The supporting layers 216 and 218 may provide reinforcement to the device 200. As seen clearly in FIG. 2, the ceramic layer 212 is preferably sandwiched between the first and second supporting layers 216 and 218. The layers forming the device 200 may be circular, rectangular, square or any other regular or irregular shape; however, a circular shape is preferred. Alternatively, only a first supporting layer 216 may be selected.

In addition, an adhesive is selected to comprise the adhesive layers 220 and 222. Alternatively, if only a first supporting layer 216 is selected, it may be that only one adhesive layer 220 is selected. The adhesive may be any thermoset or thermoplastic adhesive and is preferably conductive. For example, a nickel or silver powder may be mixed with the adhesive to enhance its conductivity. In the exemplary embodiment, the adhesive layers are comprised of a commercially available polyamic acid.

Returning to FIG. 1, as seen in control block 110, one or more of the adhesive layers 220 and 222 are applied to at least one surface of at least one of the ceramic or supporting layers 212, 216, and 218. The adhesive layer 220 or 222 is preferably applied to the first and/or second surface 214a or 214b of the ceramic layer 212. However, alternatively, or in addition to, the adhesive layers 220 and 222 may be applied to a first surface 224a or 226a of the first or second supporting layer 216 or 218. The adhesive layer may be applied by spraying, as a thin deformable sheet, or a brushed or rolled-on liquid or gel, as is well known in the art. The activation, i.e. melting, temperature of the adhesive depends upon the particular adhesive used, but is typically in the range of about 100° C. to about 300° C. Thermal set epoxies typically require heating in the lower end of this range, whereas hot melt thermal plastic requires the higher activation temperatures.

As seen in control block 120, the ceramic and/or supporting layers 212, 216, and 218 having the applied adhesive are heated to a first, or pre-cure, temperature, and as seen in control block 130, the layers 212, 216, or 218 are allowed to cool to a first ambient temperature; these heating and cooling steps may collectively be termed a pre-cure step. The first ambient temperature is preferably the temperature of the surrounding air; however, the first ambient temperature may be also higher or lower than the surrounding air temperature. Preferably, the first temperature is below the activation, or melting, temperature of the adhesive. For example, if the LARC-SI™ brand adhesive is used, the layers 212, 216, or 218 having the applied adhesive may be heated to a temperature of 100° C., although the pre-cure temperature may be different for other adhesives. In addition, the pre-cure temperature may be varied for the particular adhesive. In doing so the amount of pre-stress in the finished piezoelectric device 400 (as seen in FIG. 4) may be adjusted; varying the pre-cure temperature will commensurately vary the melting or activation temperature of the adhesive. Thus, pre-curing the adhesive allows curing of the adhesive (discussed below) to occur at a lower temperature. And, the ceramic and supporting layers 212, 216, and 218, based upon their coefficients of thermal expansion, expand relative to the cure temperature. Thus, the amount of pre-stress, or flex, in the piezoelectric device 400 may be varied by varying the cure temperature, and the characteristics of the piezoelectric device 400, such as durability and performance, may be varied.

As seen in control block 140, the layers 212, 216, 218, 220, and 222 are assembled into a stack 300 in a hot press 301, the assembly being depicted in FIG. 3. The hot press 301 includes an upper cup portion 302 and a lower cup portion 304, which preferably may be assembled to provide heat and pressure to the stacked layers 212, 216, 218, 220, and 222. In order to anchor the layers 212, 216, 218, 220, and 222 as they are assembled, a pin 306 may be inserted through apertures (not shown) in the layers 212, 216, 218, 220, and 222. The upper cup portion 302 may include a recess 308 which accepts one end 310 of the pin 306 when the upper and lower cup portions 302 and 304 are assembled.

As seen in control block 150, the stack 300 is heated to a temperature above that of the activation, or melting, temperature of the adhesive, and as seen in control block 160, the stack 300 is then allowed to cool to a second, or final, ambient temperature. These heating and cooling steps may collectively be termed the cure step. The second ambient temperature is preferably the temperature of the surrounding air; however, the second ambient temperature may be also higher or lower than the surrounding air temperature. In addition, while the heat is applied to the stack 300, pressure and/or a vacuum may also be applied to the stack 300, as is well known in the art. The melting temperature of the adhesive is dependent upon both the type of adhesive used and the pre-cure of the adhesive. For example, if, as in the preferred embodiment, a polyamic acid adhesive having been pre-cured at 100° C. is used, the stack 300 may be heated to 230° C., at which temperature the adhesive will melt. As the adhesive cools and solidifies, the ceramic layer 212 is bonded to the one or more supporting layers 216 and 218 by the adhesive layers 220 and 222 to form the integrally bonded, multiple layer laminate piezoelectric device 400 (seen in FIG. 4). As a result of the difference in coefficients of thermal expansion of the materials comprising the various layers 212, 216, and 218, as the device 400 cools to ambient temperature, mechanical stress is imparted into the layers 212, 216, and 218, causing a doming effect, as shown in FIG. 4. The amount of stress imparted is dependent on the temperature to which the layers 212, 216, and 218 are heated during the cure step. Due to pre-curing the adhesive, the temperature achieved during the cure step may be controlled, and thus, the amount of pre-stress may also be controlled.

INDUSTRIAL APPLICABILITY

In the exemplary embodiment of the present invention, a method for manufacturing piezoelectric devices is disclosed. The method allows the amount of pre-stress imparted to the manufactured piezoelectric device 400 to be varied without varying the materials used in the manufacture of the device 400. Pre-curing the adhesive, i.e. heating it to a temperature below the activation temperature of the adhesive, changes the activation temperature of the adhesive. Thus, during the cure step, the stack 300 need only be heated to the modified activation temperature to melt the adhesive and bond the layers. Thus, the amount of pre-stress imported to the device 400 is also modified.

It will be readily apparent to those skilled in the art that various changes and modifications of an obvious nature may be made, and all such changes and modifications are considered to fall within the scope of the appended claims. Other embodiments of the invention will be apparent to those skilled in the art from consideration of the specification and practice of the invention as disclosed herein. It is intended that the specification and examples be considered as exemplary only, with a true scope and spirit of the invention being indicated by the following claims and their equivalents.

What is claimed is:

1. A method for manufacturing a piezoelectric actuator, comprising: applying a first adhesive to at least one of a first surface of a piezoelectric layer and a first surface of a first supporting layer, the piezoelectric layer and the first supporting layer each having at least first and second surfaces; heating the at least one layer having the applied adhesive to a first temperature to modify an activation temperature of the applied adhesive, cooling the at least one layer having the applied adhesive to a first ambient temperature, assembling the piezoelectric and first supporting layers into a stack, the applied adhesive being disposed between the piezoelectric layer and the first supporting layer; heating the stack to a second temperature lower than an unmodified activation temperature of the adhesive to activate the adhesive; and cooling the stack to a second ambient temperature.

2. The method, as set forth in claim 1, wherein the first temperature is less than the second temperature.

3. The method, as set forth in claim 1, wherein the first temperature is less than the unmodified activation temperature of the first adhesive and the second temperature is greater than the modified activation temperature of the first adhesive.

4. The method, as set forth in claim 1, wherein the applying step includes:
   applying a second adhesive to at least one of a first surface of a second supporting layer and the second surface of the piezoelectric layer, the second supporting layer having first and second surfaces;
   wherein the first heating step includes heating the second supporting layer to the first temperature;
   wherein the first cooling step includes cooling the second supporting layer to the first ambient temperature; and
   wherein the assembling step includes:
   assembling the piezoelectric layer, the first supporting layer, and the second supporting layer into a stack, the piezoelectric layer disposed between the first and second supporting layers, and the second adhesive being disposed between the piezoelectric layer and the second supporting layer.

5. The method, as set forth in claim 1, wherein the piezoelectric layer and the first supporting layer each have an aperture and wherein a pin is disposed within the apertures of the piezoelectric layer and the first supporting layer.

6. The method, as set forth in claim 1, wherein the applying step includes:
   applying the first adhesive to the first surface of the piezoelectric layer and the first surface of the first supporting layer, and
   wherein the assembling step includes:
   positioning the first surface of the piezoelectric layer adjacent to the first surface of the first supporting layer.

7. A method for manufacturing a piezoelectric actuator, comprising: pre-heating an adhesive to modify an activation temperature of the adhesive; assembling a stack comprised of a piezoelectric layer and a first supporting layer, the adhesive disposed there between; heating the stack above the modified activation temperature of the adhesive, but below an unmodified activation temperature of the adhesive; and cooling the stack to a final ambient temperature.

8. The method, as set forth in claim 7, wherein the pre-heating step includes: heating the adhesive to a temperature below the unmodified activation temperature of the adhesive: and cooling the adhesive to a first ambient temperature.

9. The method, as set forth in claim 8, wherein the assembling step includes:
   assembling the stack comprised of the piezoelectric layer, the first supporting layer, and a second supporting layer, the piezoelectric layer disposed between the first and second supporting layers, and the adhesive being disposed between both the piezoelectric layer and the second supporting layer and the piezoelectric layer and the first supporting layer.

10. The method, as set forth in claim 8, wherein the piezoelectric layer and the first supporting layer each have an aperture and wherein a pin is disposed within the apertures of the piezoelectric layer and the first supporting layer.

11. A method for manufacturing a piezoelectric actuator, comprising selecting a first adhesive layer, a piezoelectric layer, and a first supporting layer; pre-heating the adhesive layer to modify an activation temperature of the adhesive layer; assembling a stack comprised of the piezoelectric layer and the first supporting layer with the first adhesive layer disposed there between; and curing the stack to form a bonded laminate, wherein curing occurs at at least the modified activation temperature but below an unmodified activation temperature.

12. The method, as set forth in claim 11, wherein the piezoelectric layer, the first supporting layer, and the first adhesive layer each has first and second surfaces; and
   wherein the assembling step includes disposing the first surface of the piezoelectric layer adjacent to the first surface of the first adhesive layer and disposing the second surface of the first adhesive layer adjacent to the first surface of the first supporting layer.

13. The method, as set forth in claim 11, wherein the per-heating step includes:
   heating the first adhesive layer to a first temperature; and
   cooling the first adhesive layer to a first ambient temperature;
   wherein the curing step includes:
   heating the stack to a second temperature; and
   cooling the stack to a second ambient temperature; and
   wherein the first temperature is less than the second temperature.

14. The method, as set forth in claim 13, wherein the first temperature is below the unmodified activation temperature of the first adhesive layer, and wherein the second temperature is above the modified activation temperature of the first adhesive layer.

15. The method, as set forth in claim 11, wherein the pre-heating step includes:
    positioning the first surface of the piezoelectric layer adjacent to the first surface of the first adhesive layer;
    heating the piezoelectric layer and the first adhesive layer to a first temperature; and
    cooling the piezoelectric layer and the first adhesive layer to a first ambient temperature.

16. The method, as set forth in claim 11, wherein the selecting step includes:
    selecting a second supporting layer and a second adhesive layer;
    wherein the pre-heating step includes:
    pre-heating the second adhesive layer;
    wherein the assembling step includes:
    assembling the stack comprised of the piezoelectric layer, the first supporting layer, and the second supporting layer, with the first adhesive layer disposed between the piezoelectric layer and the first supporting layer and the second adhesive layer disposed between the piezoelectric layer and the second supporting layer.

17. The method, as set forth in claim 16, wherein the piezoelectric layer, the first supporting layer, the second supporting layer, the first adhesive layer, and the second adhesive layer each has first and second surfaces; and
    wherein the assembling step includes disposing the first surface of the piezoelectric layer adjacent to the first surface of the first adhesive layer, disposing the second surface of the first adhesive layer adjacent to the first surface of the first supporting layer, disposing the second surface of the piezoelectric layer adjacent to the first surface of the second adhesive layer, and disposing the second surface of the second adhesive layer adjacent to the first surface of the second supporting layer.

* * * * *